United States Patent
Honke et al.

(10) Patent No.: US 9,290,860 B2
(45) Date of Patent: Mar. 22, 2016

(54) METHOD OF MANUFACTURING SILICON CARBIDE SINGLE CRYSTAL AND SILICON CARBIDE SINGLE CRYSTAL SUBSTRATE

(71) Applicant: SUMITOMO ELECTRIC INDUSTRIES, LTD., Osaka-shi, Osaka (JP)

(72) Inventors: Tsubasa Honke, Itami (JP); Kyoko Okita, Itami (JP); Tomohiro Kawase, Itami (JP); Tsutomu Hori, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/284,527

(22) Filed: May 22, 2014

(65) Prior Publication Data

US 2015/0010726 A1    Jan. 8, 2015

(30) Foreign Application Priority Data

Jul. 3, 2013    (JP) .................................. 2013-139782

(51) Int. Cl.
| | |
|---|---|
| *B32B 3/00* | (2006.01) |
| *C30B 23/00* | (2006.01) |
| *C30B 29/36* | (2006.01) |

(52) U.S. Cl.
CPC .............. *C30B 23/00* (2013.01); *C30B 23/002* (2013.01); *C30B 29/36* (2013.01); *Y10T 428/21* (2015.01)

(58) Field of Classification Search
CPC ...... C03B 23/00; C03B 23/005; C03B 23/02; C03B 29/36; Y10T 117/1016; Y10T 117/1068; Y10T 117/1004
See application file for complete search history.

(56) References Cited

U.S. PATENT DOCUMENTS

| | | | |
|---|---|---|---|
| 2009/0302326 A1* | 12/2009 | Maruyama | ...................... 257/77 |
| 2011/0217224 A1* | 9/2011 | Nishiguchi | ................... 423/345 |
| 2011/0308449 A1* | 12/2011 | Katsuno et al. | .................. 117/84 |

FOREIGN PATENT DOCUMENTS

JP    2001-294499 A    10/2001

* cited by examiner

*Primary Examiner* — Elizabeth Mulvaney
(74) *Attorney, Agent, or Firm* — Drinker Biddle & Reath LLP

(57) ABSTRACT

Quality of a silicon carbide single crystal is improved. A crucible having first and second sides is prepared. A solid source material for growing silicon carbide with a sublimation method is arranged on the first side. A seed crystal made of silicon carbide is arranged on the second side. The crucible is arranged in a heat insulating container. The heat insulating container has an opening facing the second side. The crucible is heated such that the solid source material sublimes. A temperature on the second side is measured through the opening in the heat insulating container. The opening has a tapered inner surface narrowed toward the outside of the heat insulating container.

9 Claims, 10 Drawing Sheets

METHOD OF MANUFACTURING SILICON CARBIDE SINGLE CRYSTAL AND SILICON CARBIDE SINGLE CRYSTAL SUBSTRATE

BACKGROUND OF THE INVENTION

1. Field of the Invention

The present invention relates to a method of manufacturing a silicon carbide single crystal and a silicon carbide single crystal substrate.

2. Description of the Background Art

Use of silicon carbide (SiC) as a semiconductor material has actively been studied in recent years. Wide band gap of SiC can contribute to enhancement of performance of a semiconductor device. In manufacturing an SiC semiconductor, normally, an SiC substrate is required. An SiC substrate (wafer) can be formed by slicing an SiC single crystal (ingot).

Japanese Patent Laying-Open No. 2001-294499 (Patent Document 1) discloses a silicon carbide single crystal wafer having a diameter not smaller than 50 mm and used for a substrate for growing an epitaxial thin film. According to this publication, deviation in orientation of a growth surface between any two points in a wafer plane can be not more than 60 seconds/cm and thereby a thin film of good quality can epitaxially be grown on the entire surface of the wafer.

According to the studies conducted by the present inventors, simply by controlling deviation in orientation of the growth surface of the silicon carbide single crystal substrate as in the technique in Japanese Patent Laying-Open No. 2001-294499, variation in manufacturing of a semiconductor device manufactured with this silicon carbide substrate could not sufficiently be lessened.

SUMMARY OF THE INVENTION

The present invention was made in view of the problem above, and an object thereof is to provide a method of manufacturing a silicon carbide single crystal of high quality and a silicon carbide single crystal substrate allowing more stable manufacturing of a semiconductor device.

A method of manufacturing a silicon carbide single crystal according to the present invention has the following steps. A crucible having a first side and a second side opposite to the first side is prepared. A solid source material for growing silicon carbide with a sublimation method is arranged on the first side in the crucible. A seed crystal made of silicon carbide is arranged on the second side in the crucible. The crucible is arranged in a heat insulating container. The heat insulating container has an opening facing the second side of the crucible. The crucible is heated such that the solid source material sublimes. A temperature on the second side of the heated crucible is measured through the opening in the heat insulating container. The opening in the heat insulating container has a tapered inner surface narrowed toward the outside of the heat insulating container.

A silicon carbide single crystal substrate according to the present invention is made of a silicon carbide single crystal having a main surface in a shape encompassing a circle having a diameter of 100 mm. Angle distribution in a direction obtained by projecting a c axis on the main surface is within 3°.

According to the manufacturing method in the present invention, quality of a silicon carbide single crystal can be improved. According to the silicon carbide single crystal substrate in the present invention, a semiconductor device can be manufactured in a more stable manner.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
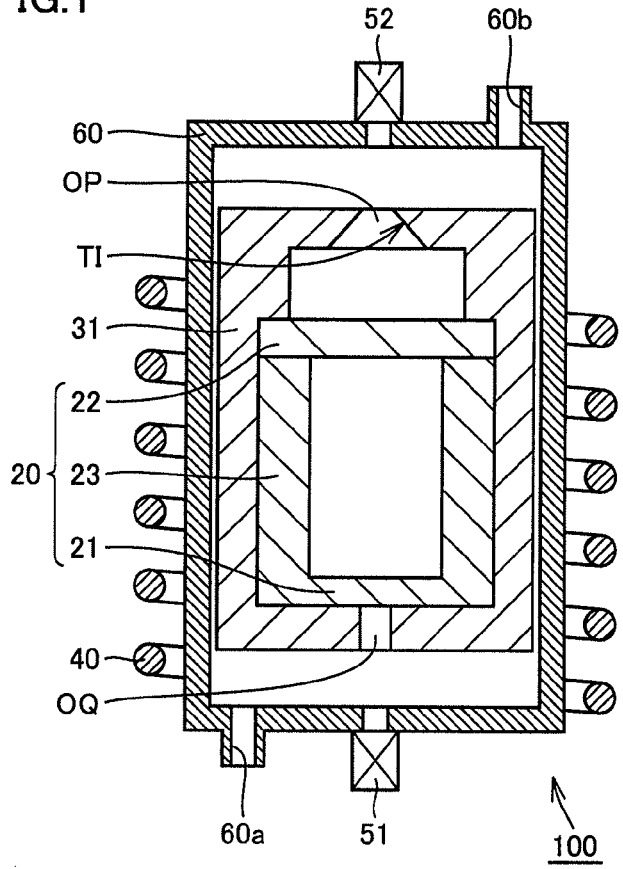
FIG. 1 is a cross-sectional view schematically showing a construction of a manufacturing apparatus for a method of manufacturing a silicon carbide single crystal in a first embodiment of the present invention.

An embodiment of the present invention will be described hereinafter with reference to the drawings.

Initially, outlines of an embodiment will be described in (i) to (ix) below.

(i) A method of manufacturing a silicon carbide single crystal 19 has the following steps. A crucible 20 having a first side 21 and a second side 22 opposite to first side 21 is prepared. A solid source material 11 for growing silicon carbide with a sublimation method is arranged on first side 21 in crucible 20. A seed crystal 12 made of silicon carbide is arranged on second side 22 in crucible 20. Crucible 20 is arranged in a heat insulating container 31 to 34. Heat insulating container 31 to 34 has an opening OP facing second side 22 of crucible 20. Crucible 20 is heated such that solid source material 11 sublimes and recrystallizes on seed crystal 12. A temperature of second side 22 of heated crucible 20 is measured through opening OP in heat insulating container 31 to 34. Opening OP in heat insulating container 31 to 34 has a tapered inner surface TI narrowed toward the outside of heat insulating container 31 to 34.

According to the present manufacturing method, opening OP in heat insulating container 31 to 34 has tapered inner surface TI narrowed toward the outside of heat insulating container 31 to 34. Thus, clogging of opening OP due to recrystallization of silicon carbide on an inner surface of opening OP is suppressed. Therefore, a temperature of crucible 20 can be measured through opening OP in a stable manner. Therefore, heating for growth of silicon carbide single crystal 19 can more accurately be carried out and quality of silicon carbide single crystal 19 can be improved.

(ii) In (i) above, a direction of normal NM of tapered inner surface TI of opening OP in heat insulating container 31 to 34 may be inclined by not smaller than 120° and not greater than 170° with respect to a direction VT from first side 21 of crucible 20 to second side 22 of crucible 20. Thus, clogging of opening OP is more reliably suppressed.

(iii) In (i) or (ii) above, a depth TC of a portion of opening OP in heat insulating container 31 to 34 formed by tapered inner surface TI may be greater than ⅓ of an effective diameter DM of an opening area of opening OP in heat insulating container 31. Thus, clogging of opening OP is more reliably suppressed.

(iv) In (i) to (iii) above, tapered inner surface TI of opening OP may have surface roughness Ra<0.9 μm. Thus, clogging of opening OP is more reliably suppressed.

(v) In (i) to (iv) above, heat insulating container 32 may have a main body portion 32a and an outer portion 32b located on an outer side relative to main body portion 32a. Opening OP in heat insulating container 31 passes through main body portion 32a and outer portion 32b. Opening OP has tapered inner surface TI in outer portion 32b. Outer portion 32b is higher in density than main body portion 32a. Thus, silicon carbide is less likely to recrystallize on tapered inner surface TI. Therefore, clogging of opening OP is more reliably suppressed.

(vi) In (v) above, outer portion 32b of heat insulating container 31 may be made of at least any of glassy carbon and pyrolytic carbon. Thus, surface roughness of tapered inner surface TI of opening OP can readily be lowered.

(vii) In (v) or (vi) above, main body portion 32a of heat insulating container 31 may be made of carbon fibers. Thus, heat insulation by heat insulating container 31 can be enhanced. Therefore, heating for growth of silicon carbide single crystal 19 can more accurately be carried out.

(viii) A silicon carbide single crystal substrate 201, 202 has a main surface MS in a shape encompassing a circle having a diameter of 100 mm. Angle distribution in a direction CP obtained by projecting a c axis on main surface MS is within 3°.

According to present silicon carbide single crystal substrate 201, 202, a semiconductor device can be manufactured in a more stable manner.

(ix) In (viii) above, main surface MS may have an off angle greater than 1° with respect to a {0001} plane. Thus, angle distribution can readily be within 3°.

Further details will now be described hereinafter as first to fifth embodiments.

First Embodiment

A manufacturing apparatus 100 used in a method of manufacturing an ingot (silicon carbide single crystal) in the present embodiment will initially be described with reference to FIG. 1. As will be described later, manufacturing apparatus 100 is an apparatus for growing an ingot of silicon carbide with a sublimation recrystallization method. Manufacturing apparatus 100 has crucible 20, heat insulating container 31, an external container 60, a heating portion 40, and radiation thermometers 51 and 52.

Crucible 20 has a container portion having a bottom portion 21 (a first side) and a side portion 23, as well as a lid portion 22 (a second side opposite to the first side). The container portion has a space for accommodating a solid source material for the sublimation recrystallization method therein. Lid portion 22 can be attached to side portion 23 of the container portion so as to close this space. In addition, lid portion 22 holds a seed crystal such that it is opposed to the space in the container portion. Crucible 20 is made, for example, of graphite.

External container 60 accommodates crucible 20. External container 60 has a gas introduction port 60a and a gas exhaust port 60b for controlling an atmosphere and a pressure therein.

Radiation thermometers 51 and 52 serve for measuring a temperature of a specific portion within external container 60. Specifically, radiation thermometer 51 is arranged to face bottom portion 21 so as to be able to measure a temperature of bottom portion 21 of crucible 20. Radiation thermometer 52 is arranged to face lid portion 22 so as to be able to measure a temperature of lid portion 22 of crucible 20.

Heat insulating container 31 accommodates crucible 20. Heat insulating container 31 has openings OP and OQ. Opening OP faces lid portion 22 of crucible 20 and is arranged between lid portion 22 and radiation thermometer 52. Opening OP has tapered inner surface TI narrowed toward the outside of heat insulating container 31. Opening OQ faces bottom portion 21 of crucible 20 and is arranged between bottom portion 21 and radiation thermometer 51. Heat insulating container 31 is preferably made of carbon fibers.

Figure 2:
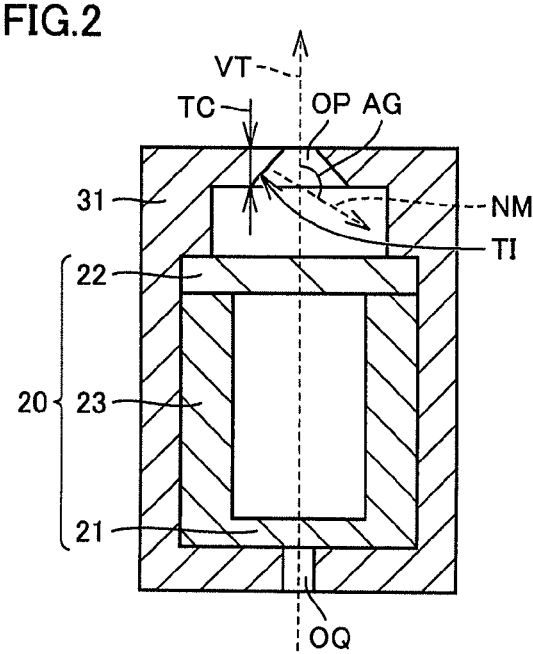
FIGS. 2 and 3 are cross-sectional views schematically showing a construction of a crucible and a heat insulating material in FIG. 1.

Referring further to FIG. 2, direction of normal NM of tapered inner surface TI of opening OP in heat insulating container 31 is inclined by an angle AG with respect to direction VT from bottom portion 21 of crucible 20 to lid portion 22 of crucible 20. Angle AG is preferably not smaller than 120° and not greater than 170°. Direction VT is preferably a direction opposite to a direction of gravity. A portion of opening OP in heat insulating container 31 formed by tapered inner surface TI has depth TC along direction VT.

Figure 3:
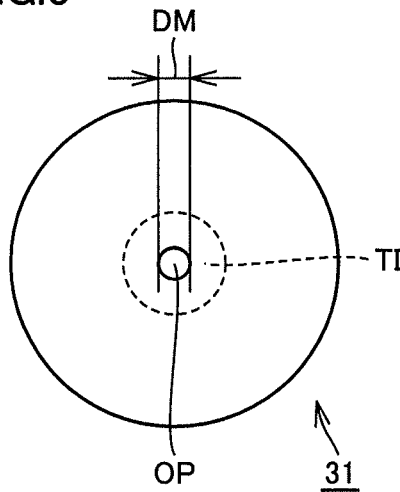

Referring further to FIG. 3, depth TC is preferably greater than ⅓ of effective diameter DM of opening OP in heat insulating container 31. The "effective diameter" here is calculated as $2 \cdot (S/\pi)^{1/2}$, where S represents an area of exposure of the inside of heat insulating container 31 through opening OP in a surface perpendicular to direction VT. In a case that a portion exposed through opening OP in the surface perpendicular to direction VT has a circular shape (in a case of FIG. 3), a diameter of this circle corresponds to the "effective diameter". The shape is preferably circular or oval and more preferably circular.

Heating portion 40 (FIG. 1) serves to heat crucible 20. Heating portion 40 is implemented, for example, by a high-frequency heating coil or a resistance heater. In a case that a high-frequency heating coil is employed, heating portion 40 is preferably arranged outside heat insulating container 31 as illustrated. In a case that a resistance heater is employed, heating portion 40 is preferably arranged inside heat insulating container 31.

Heating portion 40 is configured to be able to adjust each of a temperature of bottom portion 21 of crucible 20 and a temperature of lid portion 22 of crucible 20. For this purpose, heating portion 40 may be configured to be able to displace in direction VT (FIG. 2). In addition, heating portion 40 may have a plurality of portions of which power can be controlled independently of each other.

A method of manufacturing an ingot in the present embodiment will now be described below.

Crucible 20 described above is prepared (FIG. 4: step S10).

Figure 4:
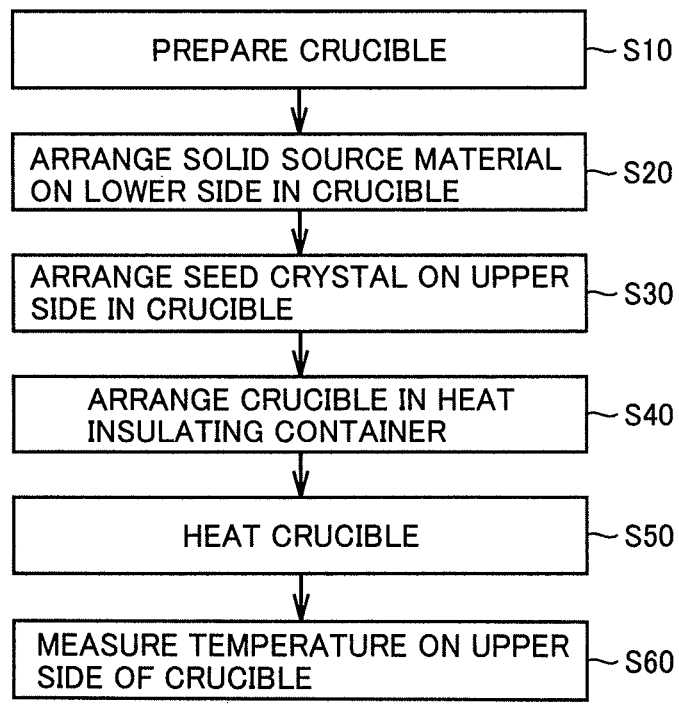
FIG. 4 is a flowchart schematically showing a method of manufacturing a silicon carbide single crystal in the first embodiment of the present invention.
Figure 5:
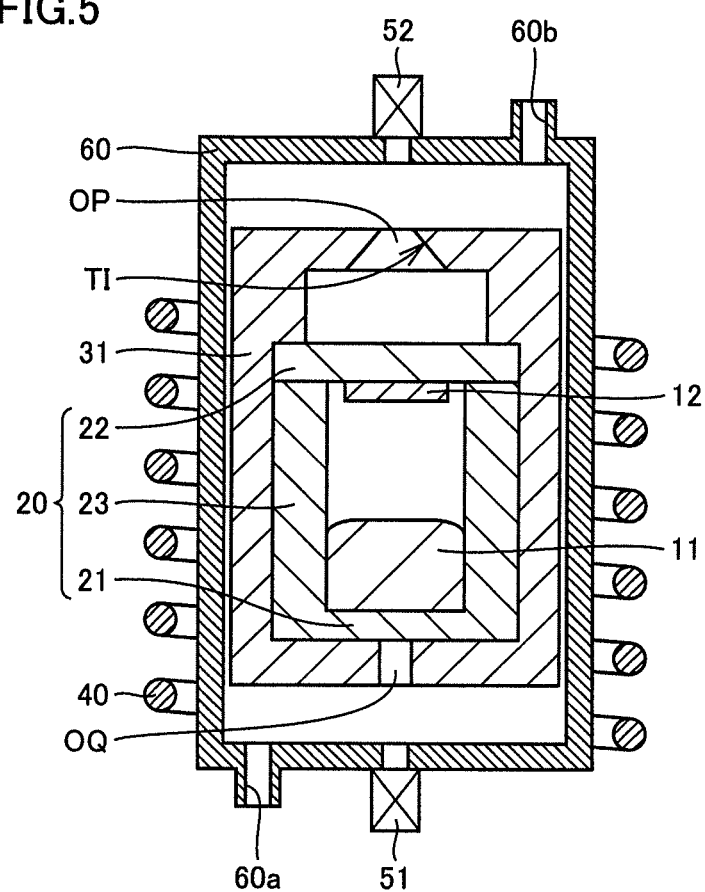
FIG. 5 is a cross-sectional view schematically showing a first step in the method of manufacturing a silicon carbide single crystal in the first embodiment of the present invention.

Referring to FIG. 5, solid source material 11 for growing silicon carbide with the sublimation method is accommodated in crucible 20. In other words, solid source material 11 is arranged on bottom portion 21 in crucible 20 (FIG. 4: step S20). Seed crystal 12 made of silicon carbide is arranged on lid portion 22 in crucible 20 (FIG. 4: step S30). Seed crystal 12 is a single crystal made of silicon carbide. Crystal structure of silicon carbide of seed crystal 12 is preferably hexagonal. In addition, a poly type of the crystal structure is preferably 4H or 6H.

Crucible 20 is then arranged in heat insulating container 31 (FIG. 4: step S40).

Figure 6:
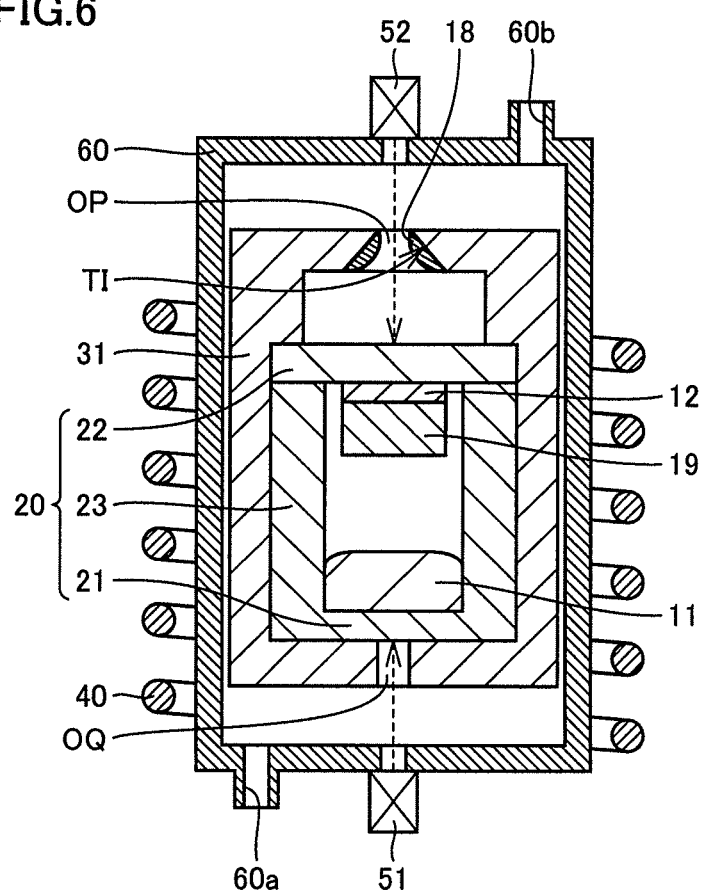
FIG. 6 is a cross-sectional view schematically showing a second step in the method of manufacturing a silicon carbide single crystal in the first embodiment of the present invention.

Referring to FIG. 6, crucible 20 is heated such that solid source material 11 sublimes and recrystallizes on seed crystal 12 (FIG. 4: step S50). Specifically, while a temperature of bottom portion 21 of crucible 20 is heated to a temperature not lower than a temperature at which silicon carbide can sublime, a temperature of lid portion 22 of crucible 20 is held at a temperature slightly lower than a temperature of the solid source material. Owing to this temperature difference, a temperature gradient necessary for the sublimation recrystallization method is provided between solid source material 11 in contact with bottom portion 21 and seed crystal 12 in contact with lid portion 22. For example, a temperature of solid source material 11 is held at a temperature not lower than 2100° C. and not higher than 2450° C., while a temperature of seed crystal 12 is held at a temperature not lower than 2000° C. and not higher than 2250° C.

In order to control the temperature gradient, a temperature of each of bottom portion 21 and lid portion 22 of heated crucible 20 is measured. Radiation thermometer 51 measures a temperature of bottom portion 21 through opening OQ. Radiation thermometer 52 measures a temperature of lid portion 22 through opening OP (FIG. 4: step S60).

With the sublimation recrystallization method described above, ingot 19 (silicon carbide single crystal) is formed on seed crystal 12.

Figure 7:
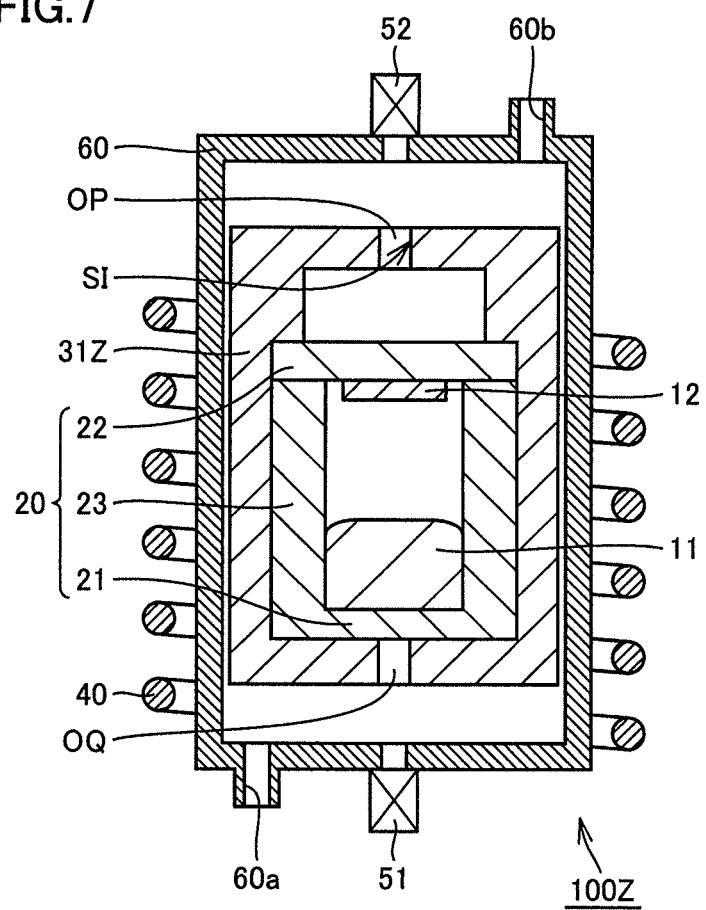
FIG. 7 is a cross-sectional view schematically showing a construction of a manufacturing apparatus in a comparative example.

Unlike heat insulating container 31 (FIG. 1) in the present embodiment, a heat insulating container 31Z of a manufacturing apparatus 100Z (FIG. 7) in a comparative example is provided with opening OP having a cylindrical inner surface SI. In this case, clogging of opening OP is likely due to a deposit 18 formed as a result of recrystallization on cylindrical inner surface SI, of a sublimation gas which leaked from crucible 20. Consequently, radiation thermometer 52 cannot precisely measure a temperature of lid portion 22 of crucible 20. Since the temperature gradient described previously cannot accurately be controlled, it becomes difficult to manufacture ingot 19 of high quality.

In contrast, according to the present embodiment, opening OP in heat insulating container 31 (FIG. 6) has tapered inner surface TI narrowed toward the outside of heat insulating container 31. Thus, clogging of opening OP by deposit 18 formed as a result of recrystallization of silicon carbide is prevented. Therefore, a temperature of crucible 20 can be measured through opening OP in a stable manner. Therefore, heating for growth of ingot 19 can more accurately be carried out and quality of ingot 19 can be improved.

Direction of normal NM of tapered inner surface TI of opening OP in heat insulating container 31 is preferably inclined by not smaller than 120° and not greater than 170°, with respect to direction VT (FIG. 2) from bottom portion 21 of crucible 20 to lid portion 22 of crucible 20. Thus, clogging of opening OP is more reliably suppressed.

Depth TC (FIG. 2) of a portion of opening OP in heat insulating container 31 formed by tapered inner surface TI is preferably greater than 1/3 of effective diameter DM (FIG. 3) of an opening area of opening OP in heat insulating container 31. Thus, clogging of opening OP is more reliably suppressed.

Second Embodiment

Figure 9:
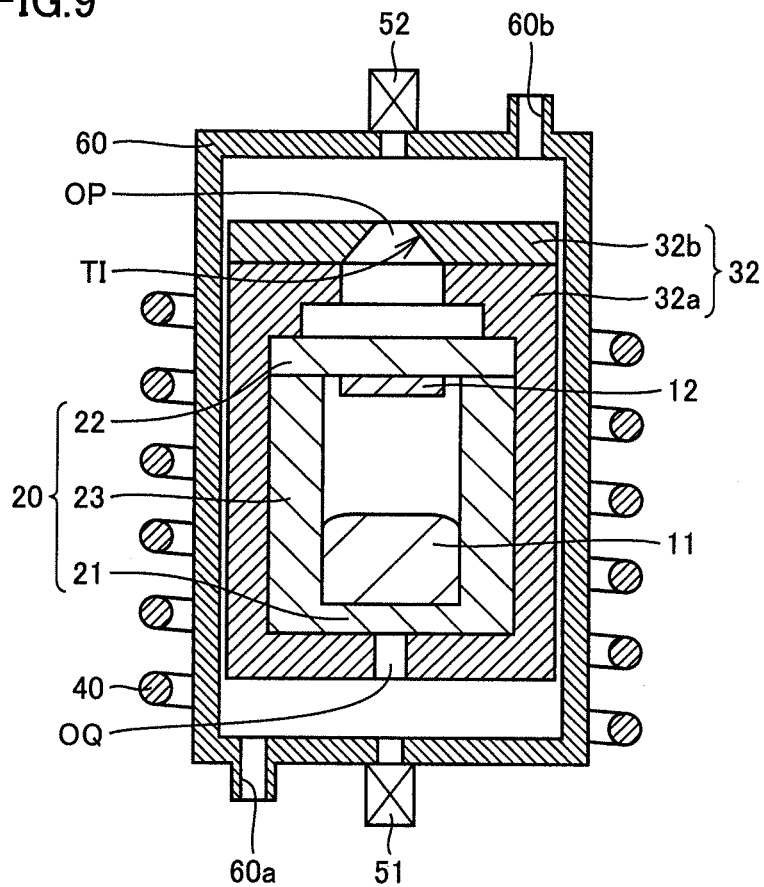
FIG. 9 is a cross-sectional view schematically showing one step in a method of manufacturing a silicon carbide single crystal in a second embodiment of the present invention.

Referring to FIG. 9, in the present embodiment, heat insulating container 32 is employed instead of heat insulating container 31 (FIG. 1) in the first embodiment. Heat insulating container 32 has main body portion 32a and outer portion 32b located on an outer side relative to main body portion 32a. Opening OP in heat insulating container 32 passes through main body portion 32a and outer portion 32b. Opening OP has tapered inner surface TI in outer portion 32b. Outer portion 32b is higher in density than, main body portion 32a.

Main body portion 32a is preferably made of carbon fibers. Outer portion 32b is preferably made of at least any of glassy carbon and pyrolytic carbon, and more preferably made of glassy carbon or pyrolytic carbon. Surface roughness Ra of tapered inner surface TI of opening OP is preferably less than 0.9 μm, more preferably less than 0.7 μm, and further preferably less than 0.5 μm.

Since the features other than the above are substantially the same as those in the first embodiment described above, the same or corresponding elements have the same reference characters allotted and description thereof will not be repeated.

According to the present embodiment, outer portion 32b provided with tapered inner surface TI is higher in density than main body portion 32a. Thus, recrystallization of silicon carbide on tapered inner surface TI is less likely and clogging of opening OP is more reliably suppressed.

In a case that surface roughness Ra of tapered inner surface TI is less than 0.9 μm, clogging of opening OP is more reliably suppressed. In a case that main body portion 32a is made of carbon fibers, heat insulation by heat insulating container 31 can be enhanced. Therefore, heating for growth of ingot 19 can more accurately be carried out. In a case that outer portion 32b is made of at least any of glassy carbon and pyrolytic carbon, surface roughness of tapered inner surface TI of opening OP can readily be lowered.

Third Embodiment

Figure 10:
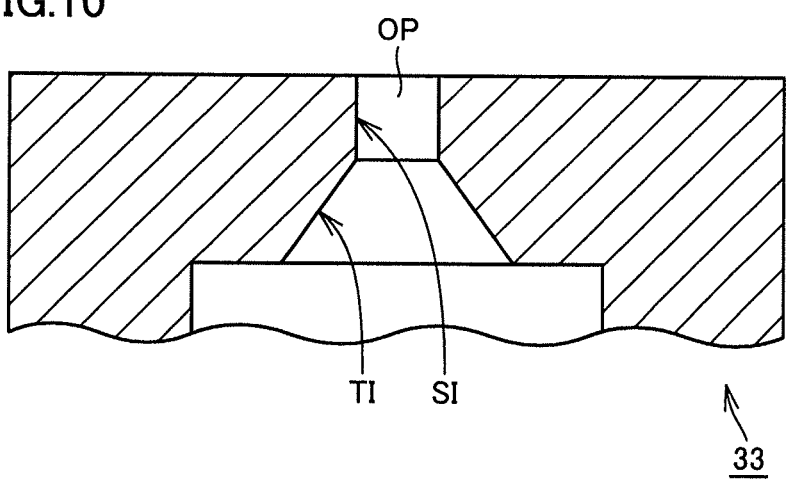
FIG. 10 is a cross-sectional view schematically showing a construction of a heat insulating material for a manufacturing apparatus for a method of manufacturing a silicon carbide single crystal in a third embodiment of the present invention.

Referring to FIG. 10, in the present embodiment, heat insulating container 33 is employed instead of heat insulating container 31 (FIG. 1) in the first embodiment. Opening OP in heat insulating container 33 is such that tapered inner surface TI and cylindrical inner surface SI are connected to each other. Cylindrical inner surface SI is preferably arranged on the outer side relative to tapered inner surface TI. Thus, clogging of cylindrical inner surface SI is less likely. Since the features other than the above are substantially the same as those in the first or second embodiment described above, the same or corresponding elements have the same reference characters allotted and description thereof will not be repeated.

Fourth Embodiment

Figure 11:
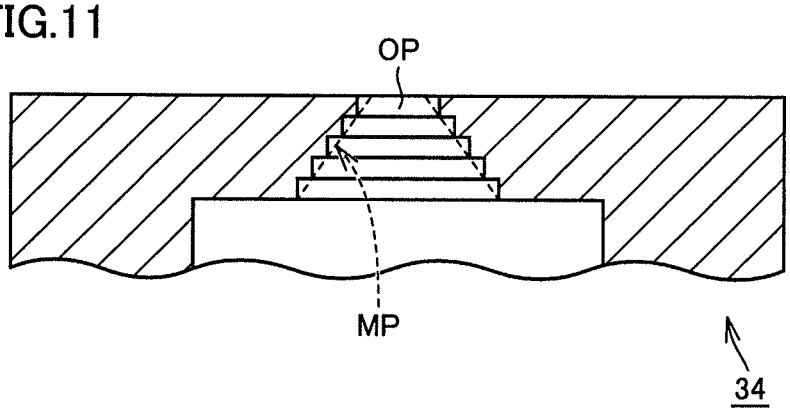
FIG. 11 is a cross-sectional view schematically showing a construction of a heat insulating material for a manufacturing apparatus for a method of manufacturing a silicon carbide single crystal in a fourth embodiment of the present invention.

Referring to FIG. 11, in the present embodiment, heat insulating container 34 is employed instead of heat insulating container 31 (FIG. 1) in the first embodiment. Opening OP in heat insulating container 34 has a tapered inner surface MP. Strictly, tapered inner surface MP includes fine features like steps. Each step has a dimension not greater than 10 mm. Since the features other than the above are substantially the same as those in the first or second embodiment described above, the same or corresponding elements have the same reference characters allotted and description thereof will not be repeated.

Fifth Embodiment

Figure 12:
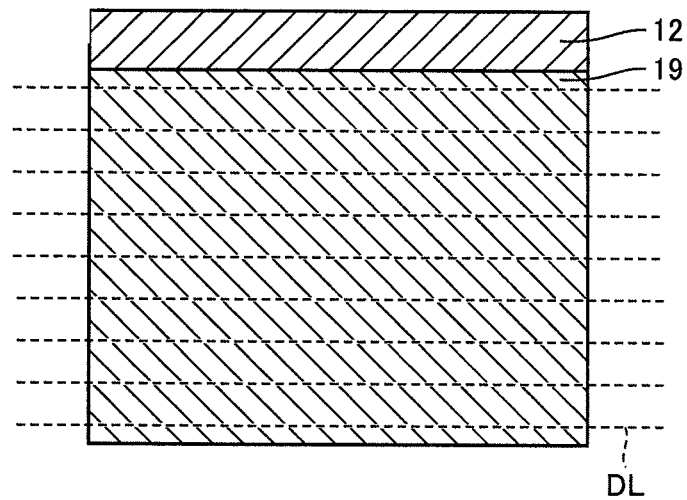
FIG. 12 is a cross-sectional view schematically showing one step in a method of manufacturing a silicon carbide single crystal substrate in a fifth embodiment of the present invention.

Referring to FIG. 12, ingot 19 obtained in any of the first to fourth embodiments is sliced along a dashed line DL.

Figure 13:
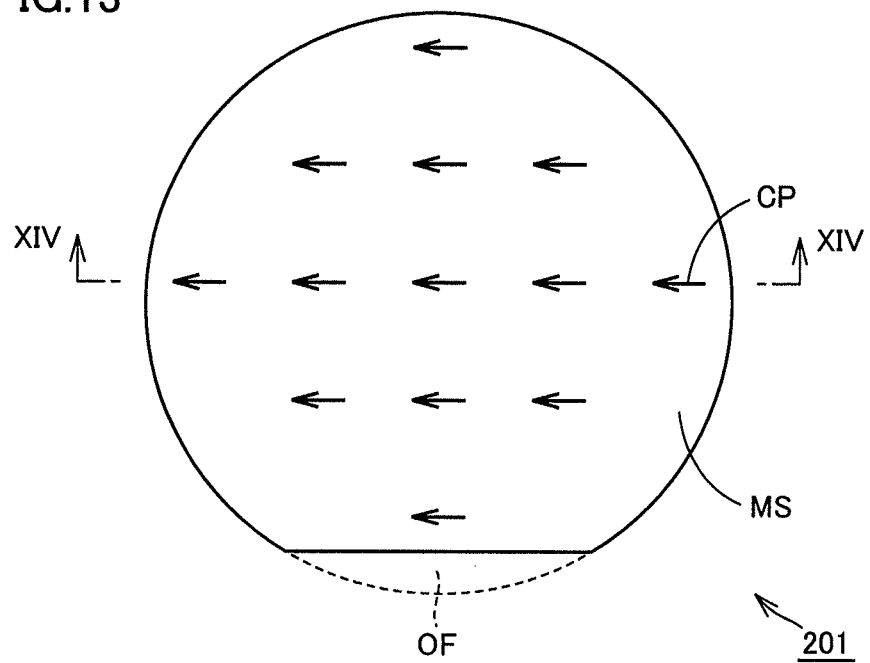
FIG. 13 is a plan view schematically showing a construction of the silicon carbide single crystal substrate in the fifth embodiment of the present invention.
Figure 14:
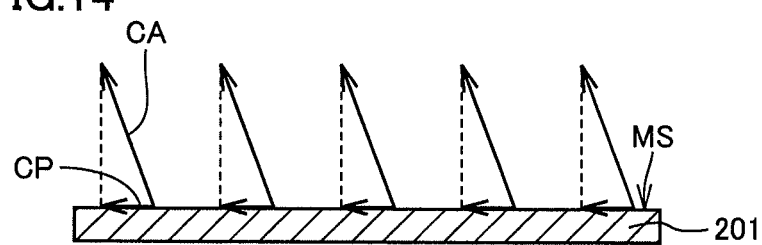
FIG. 14 is a schematic cross-sectional view along the line XIV-XIV in FIG. 13.
Figure 15:
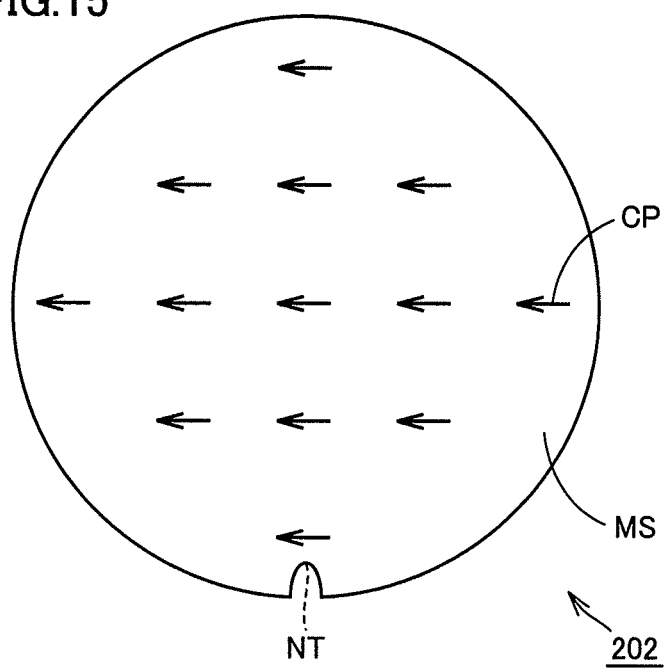
FIG. 15 is a plan view schematically showing a variation of FIG. 13.

Referring to FIGS. 13 and 14, a wafer 201 (silicon carbide single crystal substrate) is manufactured by slicing. Silicon carbide single crystal substrate 201 has main surface MS in a shape encompassing a circle having a diameter of 100 mm. In a case that wafer 201 is provided with orientation flat OF, whether or not main surface MS encompasses a circle having a diameter of 100 mm is determined, with a state without orientation flat OF being assumed (a shape shown with the dashed line in FIG. 13 being assumed). In a case of a wafer 202 having a notch NT (FIG. 15) instead of orientation flat OF, a state without notch NT is assumed.

Since quality of ingot 19 is high as described previously, quality of wafer 201 obtained therefrom is also high. Specifically, angle distribution in direction CP obtained by projecting the c axis onto main surface MS can be within 3° and it can also be within 1°. An off angle of main surface MS with respect to a {0001} plane is preferably greater than 1° and more preferably greater than 2°, and it is, for example, around 4°. An off angle is preferably smaller than 10°.

According to the present embodiment, silicon carbide single crystal substrate 201 has main surface MS in a shape encompassing a circle having a diameter of 100 mm. Since a size of a main surface is thus sufficiently ensured, a semiconductor device can efficiently be manufactured on silicon carbide single crystal substrate 201. Angle distribution in direction CP obtained by projecting the c axis onto main surface MS is within 3°. Thus, a semiconductor device can be manufactured in a more stable manner. Main surface MS preferably has an off angle greater than 1° with respect to the {0001} plane. Thus, angle distribution can readily be within 3°.

Example 1

Ingot 19 (FIG. 12) was manufactured, with angle AG, effective diameter DM, depth TC, and a material for tapered inner surface TI being defined as parameters (FIG. 2). Then, wafers of sample numbers 1 to 10 in Table 1 below were obtained from each ingot 19. Then, angle distribution in direction CP of each wafer was examined. A trench-type MOSFET (Metal Oxide Semiconductor Field Effect Transistor) was manufactured with each wafer. Then, device yield was examined by measuring a breakdown voltage of each MOSFET.

TABLE 1

| Sample Number | AG (°) | DM (mm) | DM/3 (mm) | TC (mm) | Material | Angle Distribution (°) | Device Yield (%) |
|---|---|---|---|---|---|---|---|
| 1 | 90 | 6 | 2 | None | Carbon | 3.98 | 15 |
| 2 | 120 | | | 1 | Fibers | 2.72 | 32 |
| 3 | | | | 2 | | 1.92 | 48 |
| 4 | | | | | Glassy | 1.57 | 65 |
| 5 | | | | | Carbon Pyrolytic Carbon | 1.61 | 64 |
| 6 | | | | 6 | Carbon Fibers | 1.44 | 74 |
| 7 | | 18 | 6 | | | 1.85 | 56 |
| 8 | | | | 18 | | 1.16 | 81 |
| 9 | 150 | 6 | 2 | 2 | | 1.77 | 59 |
| 10 | | | | 6 | | 0.88 | 85 |

Figure 8:
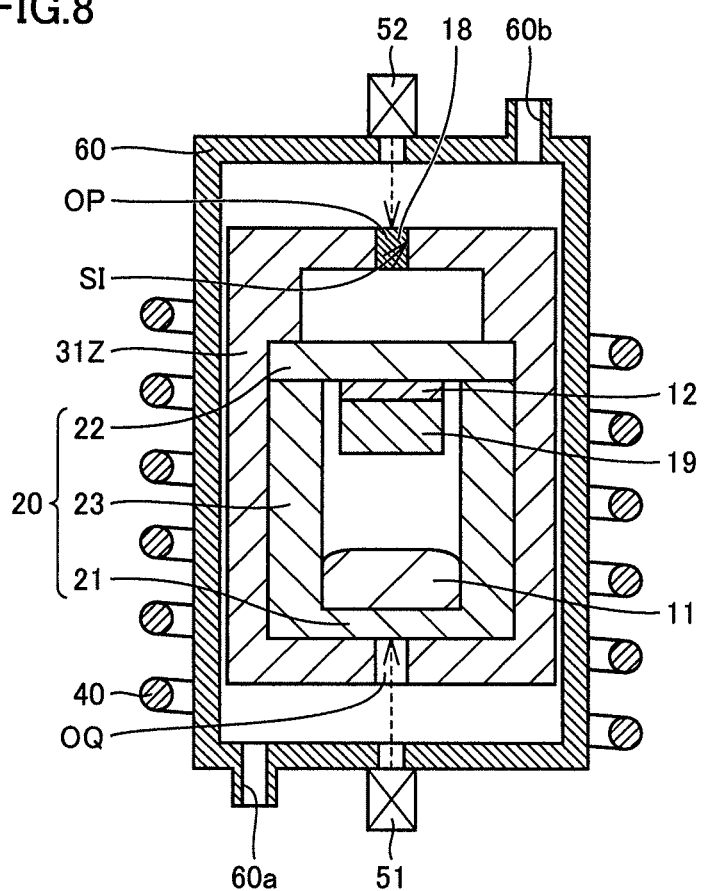
FIG. 8 is a cross-sectional view schematically showing one step in a manufacturing method in the comparative example.

In Table 1, sample number 1 represents a case that depth TC of tapered inner surface TI is set to zero, that is, a comparative example without tapered inner surface TI, and specifically a case of manufacturing apparatus 100Z (FIGS. 7 and 8) provided with cylindrical inner surface SI. Sample numbers 2 to 10 represent Examples. A material in sample numbers 4 and 5 corresponds to a material for outer portion 32b (FIG. 9), and carbon fibers were employed as a material for main body portion 32a combined with outer portion 32b.

It was found from the results in Table 1 that angle distribution and device yield were improved in a case of tapered inner surface TI (sample number 2) as compared with a case of cylindrical inner surface SI (sample number 1). It was found that angle distribution and device yield were improved in a case of TC>DM/3 (sample number 6) as compared with a case of TC=DM/3 (sample number 7). It was found from comparison among samples 3 to 5 that glassy carbon or pyrolytic carbon was preferred to carbon fibers as a material for tapered inner surface TI and glassy carbon was particularly preferred.

A shape of a portion exposed through opening OP (a shape of opening OP in FIG. 3) in a surface perpendicular to direction VT (FIG. 2) was defined to be circular, and effective diameter DM was set to 30 mm. A temperature for growing ingot 19 (FIG. 6) was set to 2200° C. and a rate of temperature increase up to this temperature was set to 500° C./hour. An Ar atmosphere at 70 kPa was set during temperature increase as an atmosphere in external container 60, and growth was started by lowering an atmospheric pressure to 2 kPa at the time point when crucible 20 has reached the growth temperature. A time period for growth was set to 100 hours and growth was stopped by raising an atmospheric pressure to 70 kPa.

In the comparative example (corresponding to sample number 1), opening OP was clogged in 24 hours after start of growth and an abnormal condition took place in measurement of a temperature of lid portion 22 by radiation thermometer 52. In contrast, opening OP was not clogged in Examples (corresponding to sample numbers 2 to 10).

Although the present invention has been described and illustrated in detail, it is clearly understood that the same is by way of illustration and example only and is not to be taken by way of limitation, the scope of the present invention being interpreted by the terms of the appended claims.

What is claimed is:
1. A method of manufacturing a silicon carbide single crystal, comprising the steps of:
   preparing a crucible having a first side and a second side opposite to said first side;
   arranging a solid source material for growing silicon carbide with a sublimation method, on said first side in said crucible;
   arranging a seed crystal made of silicon carbide on said second side in said crucible;

arranging said crucible in a heat insulating container, said heat insulating container having an opening facing said second side of said crucible;

heating said crucible such that said solid source material sublimes and recrystallizes on said seed crystal; and measuring a temperature on said second side of heated said crucible through said opening in said heat insulating container, said opening in said heat insulating container having a tapered inner surface narrowed toward outside of said heat insulating container.

2. The method of manufacturing a silicon carbide single crystal according to claim 1, wherein a direction of normal of said tapered inner surface of said opening in said heat insulating container is inclined by not smaller than 120° and not greater than 170°, with respect to a direction from said first side of said crucible to said second side of said crucible.

3. The method of manufacturing a silicon carbide single crystal according to claim 1, wherein a depth of a portion of said opening in said heat insulating container, which is formed by said tapered inner surface, is greater than ⅓ of an effective diameter of an opening area of said opening in said heat insulating container.

4. The method of manufacturing a silicon carbide single crystal according to claim 1, wherein said tapered inner surface of said opening has surface roughness Ra<0.9 μm.

5. The method of manufacturing a silicon carbide single crystal according to claim 1, wherein said heat insulating container has a main body portion and an outer portion located on an outer side relative to said main body portion, said opening in said heat insulating container passes through said main body portion and said outer portion, said opening has said tapered inner surface in said outer portion, and said outer portion is higher in density than said main body portion.

6. The method of manufacturing a silicon carbide single crystal according to claim 5, wherein said outer portion of said heat insulating container is made of at least any of glassy carbon and pyrolytic carbon.

7. The method of manufacturing a silicon carbide single crystal according to claim 5, wherein said main body portion of said heat insulating container is made of carbon fibers.

8. A silicon carbide single crystal substrate, comprising a main surface in a shape encompassing a circle having a diameter of 100 mm, angle distribution in a direction obtained by projecting a c axis on said main surface being within 3°.

9. The silicon carbide single crystal substrate according to claim 8, wherein said main surface has an off angle greater than 1° with respect to a {0001} plane.

* * * * *